(12) United States Patent
Daub et al.

(10) Patent No.: US 8,133,318 B2
(45) Date of Patent: Mar. 13, 2012

(54) EPITAXIALLY COATED SILICON WAFER WITH 110 ORIENTATION AND METHOD FOR PRODUCING IT

(75) Inventors: Erich Daub, Emmerting (DE); Hans Oelkrug, Tittmoning (DE); Oliver Schmelmer, Burghausen (DE)

(73) Assignee: Siltronic AG, Munich (DE)

( * ) Notice: Subject to any disclaimer, the term of this patent is extended or adjusted under 35 U.S.C. 154(b) by 358 days.

(21) Appl. No.: 12/454,906

(22) Filed: May 26, 2009

(65) Prior Publication Data

US 2009/0304994 A1    Dec. 10, 2009

(30) Foreign Application Priority Data

Jun. 4, 2008    (DE) .......................... 10 2008 026 784

(51) Int. Cl.
*C30B 15/00* (2006.01)
*C30B 21/06* (2006.01)
*C30B 27/02* (2006.01)
*C30B 23/00* (2006.01)
*C30B 25/00* (2006.01)
*C30B 28/12* (2006.01)

(52) U.S. Cl. .............................. 117/14; 117/13; 117/101

(58) Field of Classification Search ................. 117/13, 117/14, 902, 101
See application file for complete search history.

(56) References Cited

U.S. PATENT DOCUMENTS

| | | |
|---|---|---|
| 5,400,548 A | 3/1995 | Huber et al. |
| 5,628,823 A | 5/1997 | Chandrasekhar et al. |
| 5,769,941 A | 6/1998 | Chiou |
| 5,771,876 A | 6/1998 | Egglhuber |
| 6,159,284 A | 12/2000 | Oelkrug et al. |
| 2007/0062438 A1 | 3/2007 | Schauer et al. |
| 2007/0066036 A1 | 3/2007 | Schauer et al. |
| 2007/0066082 A1 | 3/2007 | Schauer et al. |
| 2008/0057323 A1 | 3/2008 | Dohi et al. |

FOREIGN PATENT DOCUMENTS

| | | |
|---|---|---|
| DE | 198 25 051 A1 | 9/1999 |
| DE | 198 33 257 C1 | 9/1999 |
| DE | 10 2005 045 337 A1 | 4/2007 |
| DE | 10 2005 045 338 A1 | 4/2007 |
| DE | 10 2005 045 339 A1 | 4/2007 |
| EP | 0 272 531 A1 | 6/1988 |
| EP | 0 547 894 A1 | 6/1993 |
| EP | 0 580 162 A1 | 1/1994 |
| EP | 0 962 284 B1 | 11/2001 |
| EP | 1 592 045 A1 | 2/2005 |
| JP | 63123893 A | 5/1988 |
| JP | 03080184 A | 4/1991 |

OTHER PUBLICATIONS

English Abstract corresponding to JP 03-080184A.
English Abstract corresponding to JP 63-123893A.
English Abstract corresponding to DE 198 33 257 C1.

*Primary Examiner* — Jonathan Langman
(74) *Attorney, Agent, or Firm* — Brooks Kushman P.C.

(57) ABSTRACT

An epitaxially coated silicon wafer comprises a plane surface misoriented relative to a {110} crystal plane, wherein the <110> direction of the single silicon crystal is tilted away by the angle θ from the normal to the wafer surface and the projection of the tilted <110> direction forms an angle φ with the direction <−110> in the wafer, and θ is given by $0 \leq \theta \leq 3°$ and $45° \leq \varphi \leq 90°$, as well as for all symmetrically equivalent directions.

8 Claims, 7 Drawing Sheets

EPITAXIALLY COATED SILICON WAFER WITH 110 ORIENTATION AND METHOD FOR PRODUCING IT

CROSS-REFERENCE TO RELATED APPLICATIONS

This application claims priority to German application DE 10 2008 026 784.8 filed Jun. 4, 2008, which is herein incorporated by reference.

BACKGROUND OF THE INVENTION

1. Field of the Invention

The present invention relates to a method for producing a silicon wafer with <110> crystal orientation, and to a silicon wafer produced in this way.

2. Background Art

Monocrystalline silicon, in particular in the case of silicon ingots having large diameters (>=300 mm), is grown by means of the so-called Czochralski (CZ) method. In this case, a seed crystal is brought to the surface of silicon melted in a quartz crucible and is slowly pulled upward. In this case, firstly a neck is produced, then the pulling rate is reduced and a conical region is formed which merges into a cylindrical region of the crystal. The orientation of the crystal lattice with respect to the pulling axis of the crystal is usually predetermined by the crystal orientation of the seed crystal. The crystal growth direction is usually parallel to the crystal pulling direction or perpendicular to the corresponding crystal plane of a cross section of the ingot perpendicular to the crystal pulling direction.

Numerous types of crystal defects can arise during the growth of a single crystal during the CZ method. It is desirable to grow crystals which have as few of such defects as possible. Particularly important defects are slip dislocations. Such dislocations can arise at numerous points in the crystal pulling process, but will be encountered particularly during a first part of the pulling process, caused by a temperature difference between the melt surface and the seed crystal. Dislocations are dynamic and tend to propagate in directions of minimal free energy in the crystal lattice.

During conventional crystal growth in which a <001> crystal orientation is desired, dislocations often propagate in directions that are inclined relative to the pulling axis, since these directions represent paths of minimal energy. This is disclosed in JP 03-080184, for example. Through suitable lengthening of the thin neck, these dislocations propagate to the neck surface and disappear there before the conical part and subsequently the actual cylindrical crystal piece are produced. Dislocations which propagate closer along the crystal growth axis but not parallel thereto are predominantly eliminated by thinning the neck to a relatively small diameter, that is to say producing a so-called "thin neck" (also referred to as a "dash neck" in the literature). The teaching of U.S. Pat. No. 5,628,823 includes growing a long neck having a diameter of approximately 10 mm in order to reduce dislocations, and furthermore producing a neck that can bear a corresponding weight of a long crystal.

For some applications it is desirable to provide silicon wafers having crystal orientations other than <001>. One of these alternative orientations is <110>. This crystal orientation is advantageous owing to its higher hole mobility, inter alia.

In crystals grown with <110> orientation, the crystal planes of low energies are {111} planes, that is to say perpendicular to a {110} plane. The dislocations therefore propagate in a direction parallel to the <110> crystal axis. Thus, these dislocations cannot be eliminated by growing a conventional neck since these dislocations, which lie parallel to the neck axis rather than at an angle to said axis, do not propagate to the surface of the neck. It can be seen that each silicon wafer produced from a single crystal pulled in this way would contain dislocations.

In order to avoid this problem, JP 03 080184 proposes using a seed crystal with slight misorientation, such that the directions of low energy in which the dislocations propagate are inclined slightly relative to the growth axis. As a result of tilting the directions of low energy with respect to the growth axis, the dislocations propagate to the surface of the neck and are eliminated before the cylindrical crystal piece is produced.

U.S. Pat. No. 5,769,941 is also concerned with the elimination of axially propagating dislocations in <110>-oriented crystals. This is achieved by tilting the seed crystal and thus tilting the <110> direction (normal to {110} plane) from the crystal axis, which allows the dislocations to propagate to the neck surface.

In all of the methods known in the prior art, a misoriented silicon single crystal is produced, wherein the misorientation is e.g. 2 to 5° (U.S. Pat. No. 5,769,941), or indeed any angle between the <001> and <101> directions (JP 03 080184) can be selected. JP 63 123893 discloses a crystal with a misorientation of 0.2 to 4°.

It has been shown that the extent of the misorientation greatly influences properties of the silicon wafers produced therefrom. It is often desirable to provide a silicon wafer with an epitaxial layer.

It was shown in EP 1 592 045 A1 that the surface roughness of the epitaxial layer of a <110>-misoriented wafer depends on the angle of inclination (angle between normal to wafer surface with respect to real <110> direction) and is less than the roughness of the polished silicon wafer (without an epitaxial layer). This effect can be observed at angles of inclination of 0 to 8°.

AFM micrographs show steps and shoulders in <110> orientation on the epitaxial layer. According to EP 1 592 045 A1, the width of a shoulder can be projected directly from the angle of inclination and the distance between two steps. If the angle of inclination exceeds 1°, the width of the shoulder between monoatomic layer steps is 10 nm or less.

A misorientation (angle of inclination) of 0° is practically unattainable even if attempts are made to completely reduce the misorientation again after CZ pulling by means of suitable measures (e.g. by oriented wire sawing). During wire sawing, the misorientation of a semiconductor ingot (without the beginning and end cones) is usually reduced by suitable orientation of the rod piece cemented on a sawing strip relative to the wire gang—formed from sawing wire—of a wire saw. Since a sawing strip can never be oriented completely exactly and relatively small inaccuracies cannot be precluded, a misorientation of exactly 0° will be achieved only in rare cases. Therefore, when crystals or wafers with misorientation of 0° are discussed in the context of this invention, it should be taken into account that relatively small deviations of up to approximately 10 minutes or 0.2° (also cf. JP 63 123893) should be taken into account.

A correction of the misorientation of individual rod pieces during the wire sawing process has the consequence that the sawn silicon wafers have an oval wafer shape since the wire saw gang forms an angle < > 90° with the cylindrical outer surface of the rod piece. This gives rise essentially to two problem areas in terms of production engineering: firstly, so-called "halfmoon wafers" arise as a result of the oblique cut at both rod piece ends, and make it impossible for the wafers to be isolated automatically from the carbon strip usually used, and, secondly, the complexity during edge rounding is significantly increased since special technologies have to be made available for the rounding of oval wafers. What is more, transporting oval, unrounded wafers in commercially available cassettes can lead to an increase in the probability of edge chipping, which would result in the wafers being rejected. Moreover, the manual handling of "halfmoon wafers" is associated with an increased safety risk for the operators on account of the razor-sharp edges.

SUMMARY OF THE INVENTION

The invention pertains to a method of preparing silicon wafers by growing a single crystal ingot with <110> orientation by initiating growth with a seed crystal of <110> orientation, the geometric axis of which is inclined with respect to the crystal growth axis to produce a slightly misorientated <110> single crystal ingot, the ingot is ground by oriented cylindrical grinding to a uniform diameter based on the misorientation changing the latter to a different value, and slicing and further processing wafers therefrom.

DETAILED DESCRIPTION OF THE PREFERRED EMBODIMENTS

The invention is explained below with reference to figures, which are described in greater detail.

Figure 1:
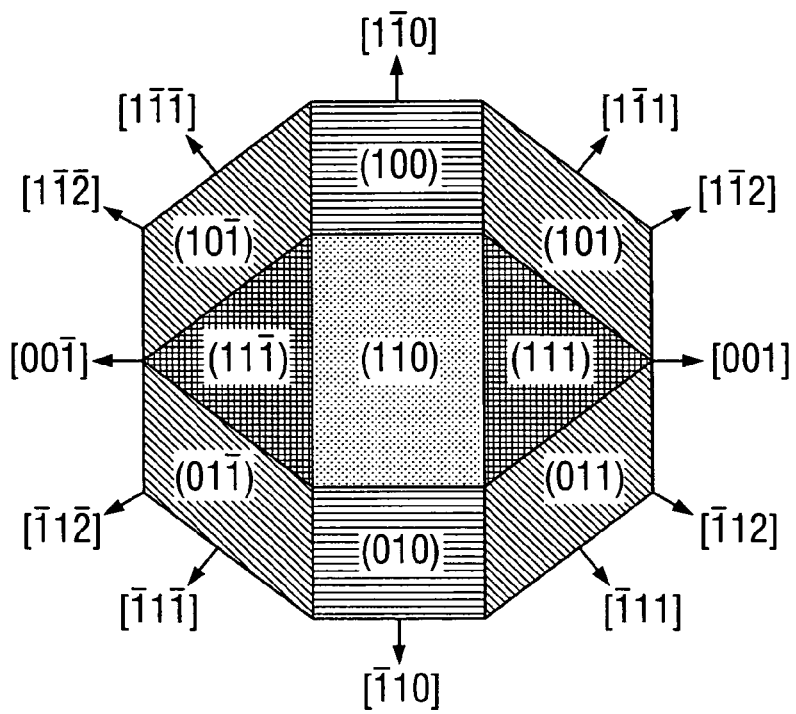
FIG. 1 shows the definition of the crystal directions.

FIG. 1 shows the definition of the crystal orientations in a two-dimensional representation.

Figure 2:
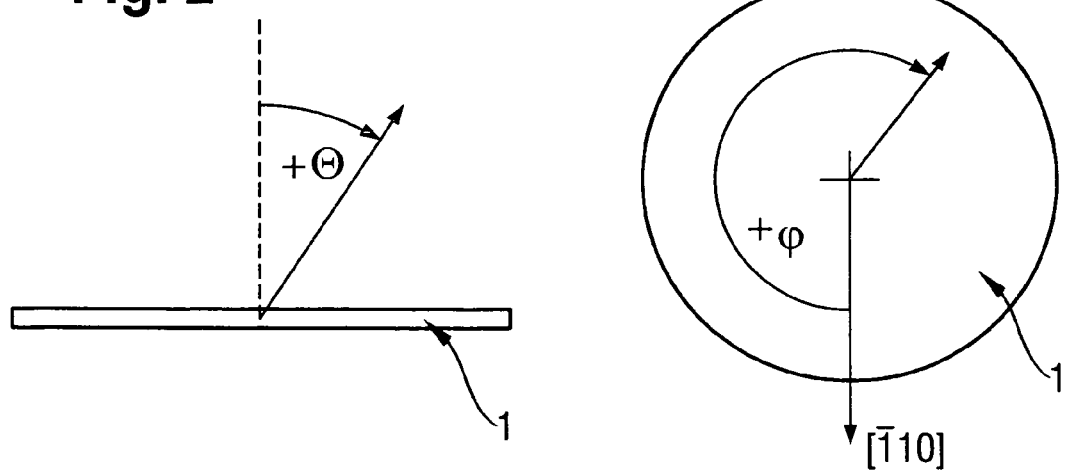
FIGS. 2 and 3 show the definition of the solid angle range of the misorientation.

FIG. 2 shows the definition of the solid angle range of the misorientation of a wafer 1. The angle $\theta$ indicates the angle of inclination in the <100> direction. The additional indication of the angle $\phi$ is necessary for the angle of the actual misorientation.

Figure 3:
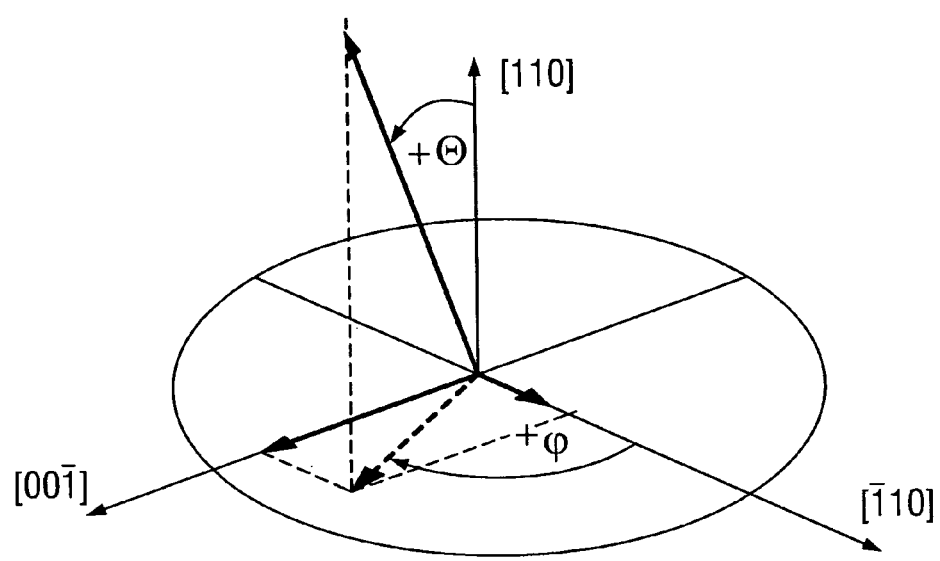

FIG. 3 shows, supplementarily to FIG. 2, the definition of the solid angle used in this invention for describing the misorientation in a three-dimensional representation.

Figure 4:
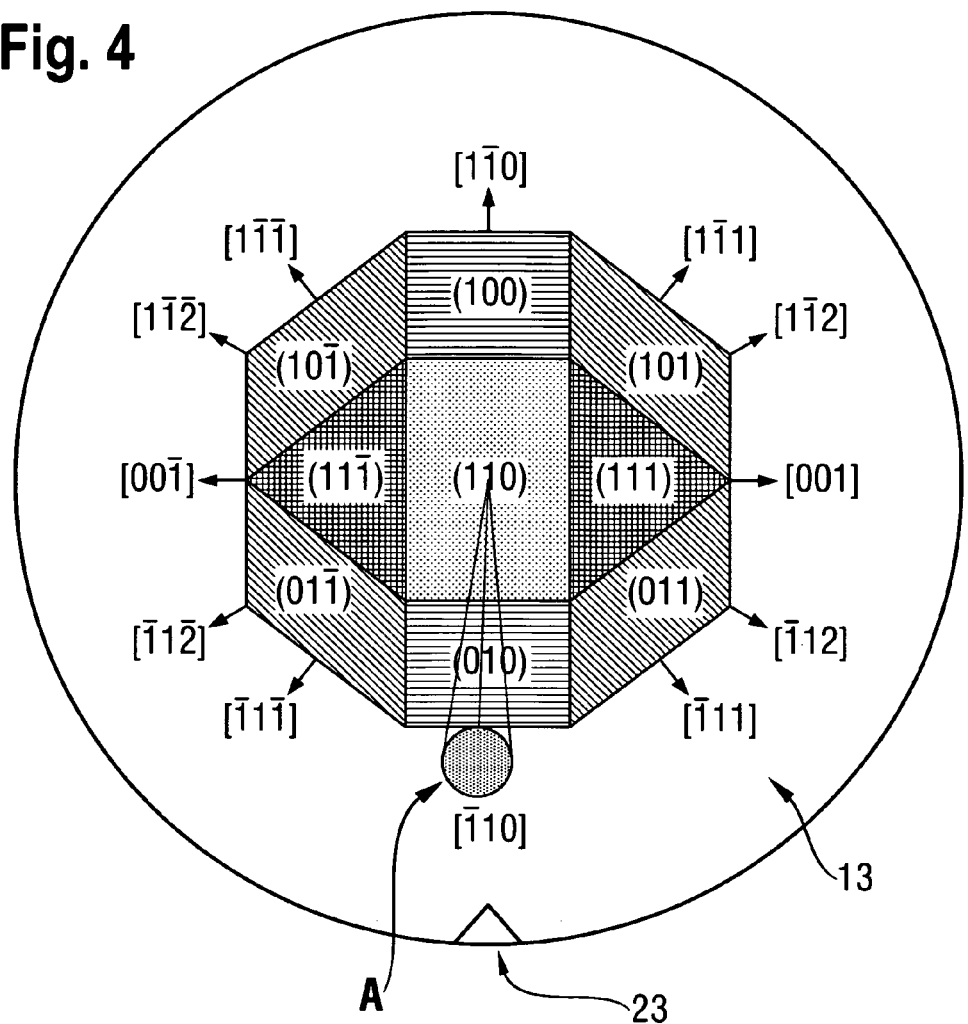
FIGS. 4-6 show solid angle ranges for specific misoriented, epitaxially coated wafers and the associated AFM micrographs.
Figure 4:
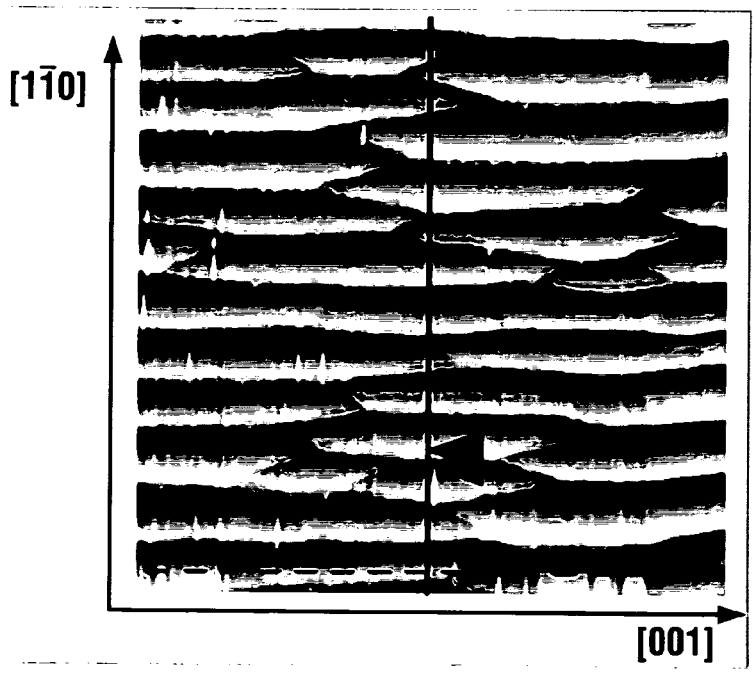

FIG. 4 shows a schematic illustration of the crystal orientation of an epitaxially coated semiconductor wafer 13 having a notch 23 in the [−110] direction. The area of the semiconductor wafer is a misoriented <110> crystal face, expressed as solid angle $\theta=2.28°$ and $\phi=4.01°$. The rotation by $\phi=1.01°$ is illustrated by reference symbol A in conjunction with the solid angle definition from FIG. 2. An AFM micrograph of the surface of the semiconductor wafer can additionally be seen. The resulting surface roughness was AFM RMS (1 μm×1 μm)=0.736 nm.

Figure 5:
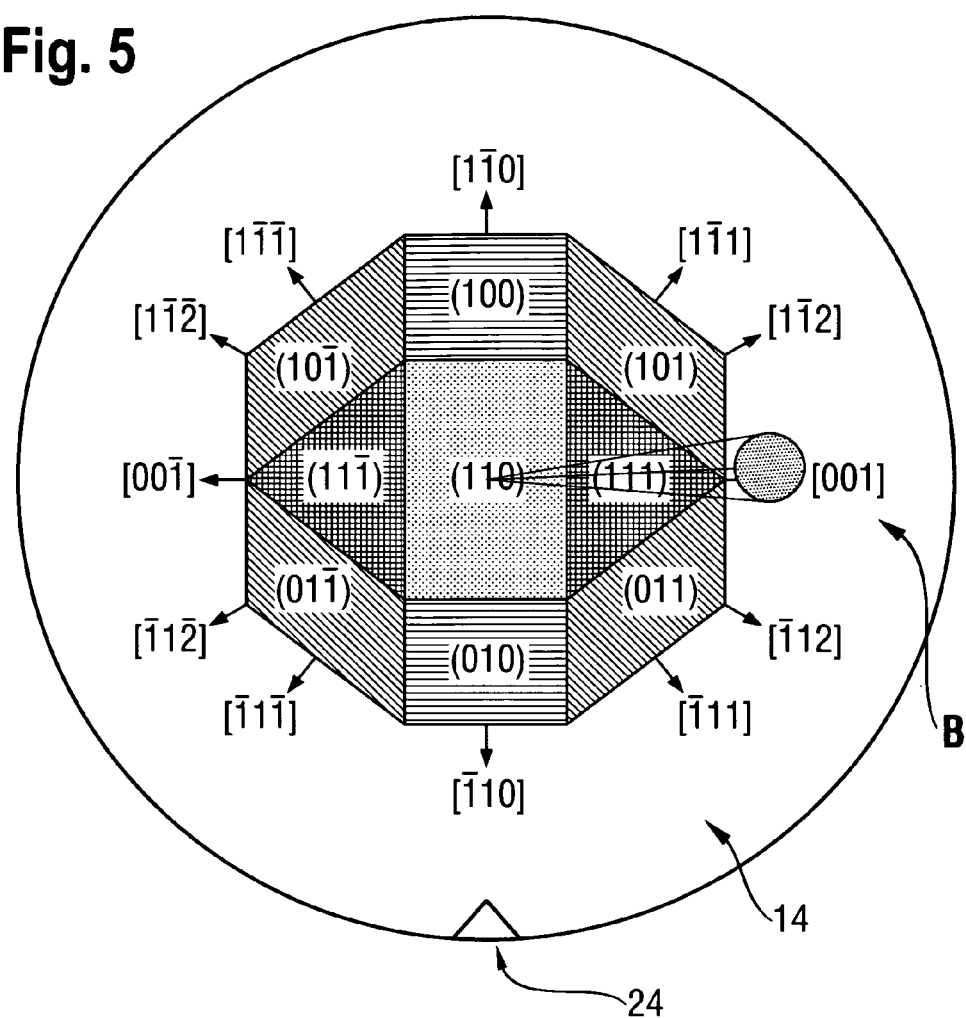
Figure 5:
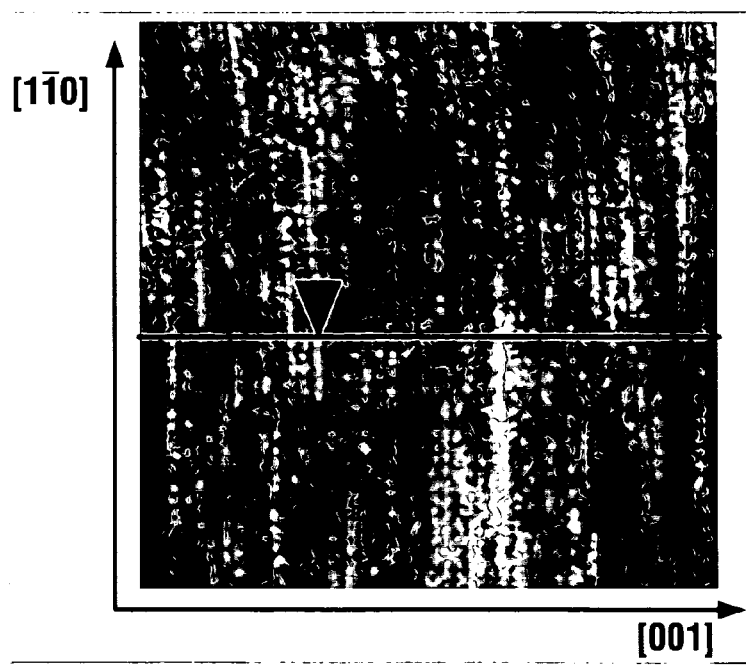

FIG. 5 shows a schematic illustration of the crystal orientation of a semiconductor wafer 14 having a notch 24 in the [110] direction. The area of the semiconductor wafer is a misoriented <110> crystal face, expressed as solid angle $\theta=1.49°$ and $\phi=264.6°$. The rotation by $\phi=264.6°$ is illustrated by the reference symbol B in conjunction with the solid angle definition from FIG. 2. An AFM micrograph of the surface of the semiconductor wafer can additionally be seen. The resulting surface roughness was AFM RMS (1 μm×1 μm)=0.089 nm.

Figure 6:
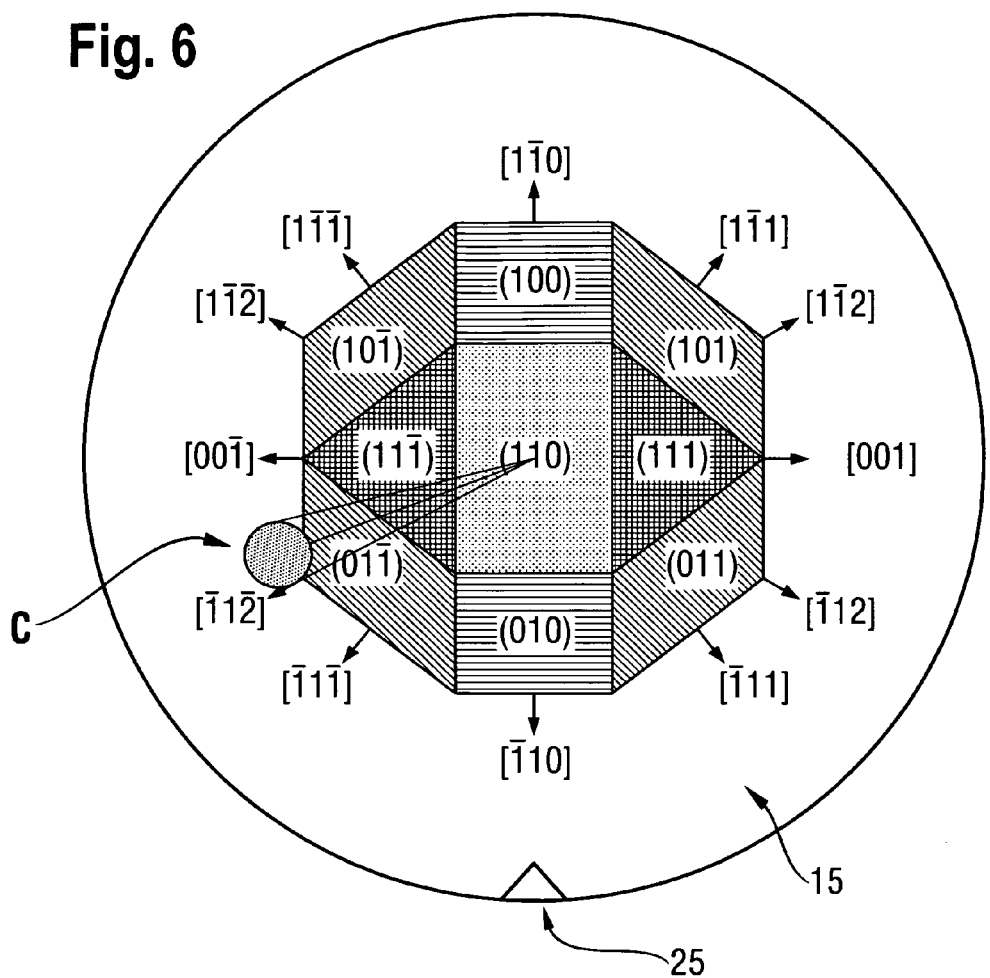
Figure 6:
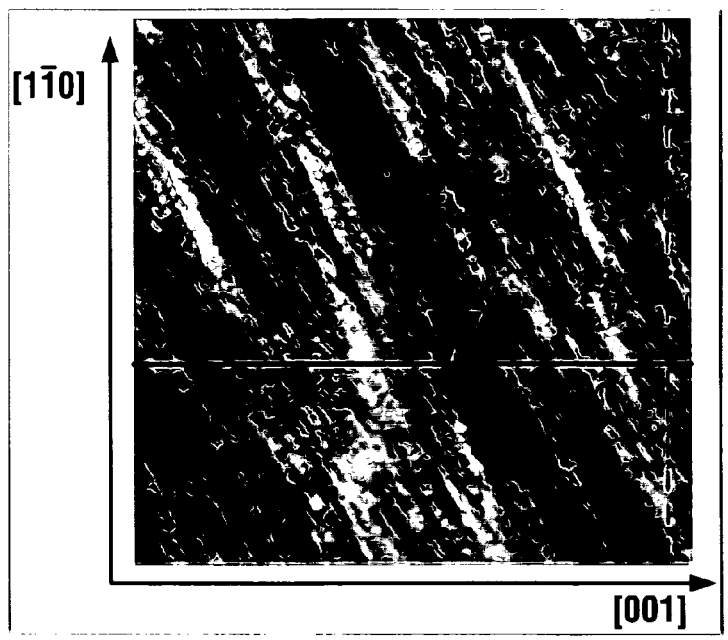

FIG. 6 shows a schematic illustration of the crystal orientation of a semiconductor wafer 15 having a notch 25 in the [110] direction. The area of the semiconductor wafer is a misoriented <110> crystal face, expressed as solid angle $\theta=1.18°$ and $\phi=68.0°$. The rotation by $\phi=68.0°$ is illustrated by the reference symbol C in conjunction with the solid angle definition from FIG. 2. An AFM micrograph of the surface of the semiconductor wafer can additionally be seen. The resulting surface roughness was AFM RMS (1 μm×1 μm)=0.054 nm.

Figure 7:
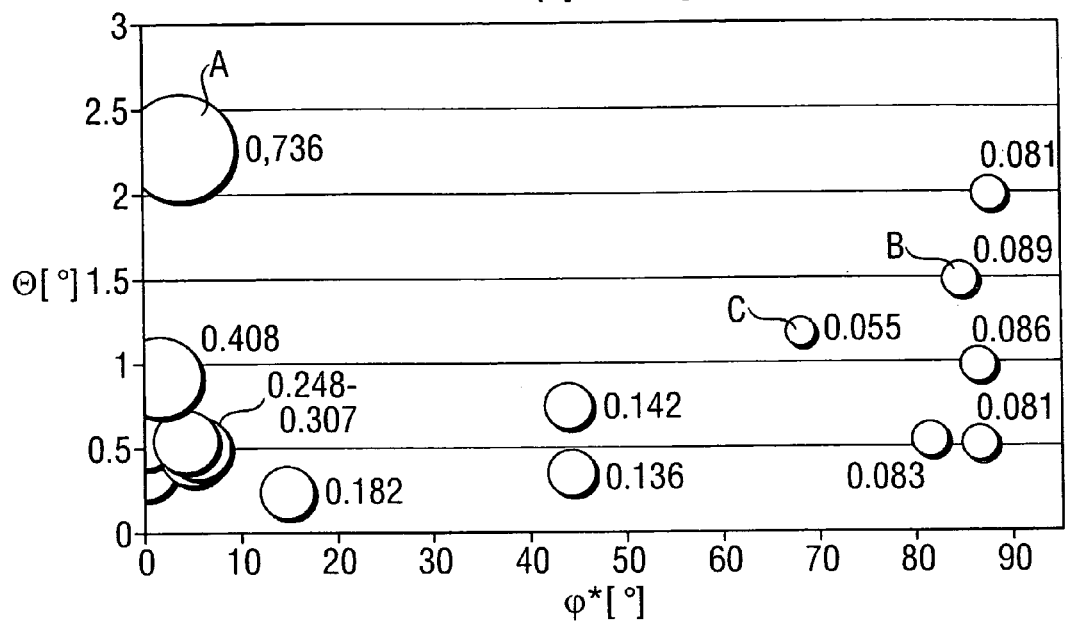
FIG. 7 schematically shows roughness values of epitaxially coated wafers for specific misorientations.

FIG. 7 shows a summary of the results from Table 1. The reference symbols A, B and C from FIGS. 4-6 are also used here.

The objects of the invention are achieved by means of a method for producing an epitaxially coated silicon wafer, comprising the following steps: a) pulling a silicon single crystal with <110> orientation according to Czochralski, using a seed crystal with <110> orientation, the geometrical axis of which is inclined by a specific angle relative to its real <110> crystal axis, such that the pulled <110>-oriented silicon single crystal also has a slight misorientation of its geometrical axis relative to its real <110> crystal axis; b) oriented cylindrical grinding of said silicon single crystal by determining the misorientation of a silicon single crystal that results after pulling, suitably orienting the single crystal clamped in between pressure members in a grinding machine, and grinding away an outer surface of single crystal until the latter has a specific, uniform diameter and the misorientation that results after pulling of the single crystal is changed; c) slicing wafers from the cylindrically ground single crystal; d) further processing of such sliced wafers by means of mechanical, chemical or chemo-mechanical methods, by means of which, however, the misorientation of the surface remains largely unchanged; e) preferably applying an epitaxial layer to a wafer that has been processed further in this way, wherein the <110> direction is tilted away by the angle $\theta$ from the normal to the wafer surface and the projection of the tilted <110> direction forms an angle $\phi$ with the direction <−110> in the wafer plane and $\theta$ is given by $0 \leq \theta \leq 3°$ and $45° \leq \phi \leq 90°$ (and a symmetrically equivalent directions).

A slightly misoriented seed is preferably used, preferably fitted on a seed holder. Preferably, the misorientation of the seed crystal is 5° or less, preferably 3° or less, most preferably 2° or less. The lower limit is limited by the requirement of dislocation-free pulling and by the neck length thus required. The misorientation is preferably directed in the direction of the nearest <100> or <111> plane (cf. FIG. 1 with regard to the definition of the crystal directions and planes). As a result, the single crystal pulled in this way also has a corresponding misorientation.

The single crystal preferably has a diameter slightly increased (a few mm) with respect to the desired final diameter of 150 mm, 200 mm, 300 mm or 450 mm. The desired final diameter is only achieved during later edge machining steps (edge grinding, polishing), on silicon wafers.

In order to be able to pull a dislocation-free crystal, the dash necking method is employed, wherein after the seed crystal has been brought into contact with the polysilicon melt situated in a crucible, firstly a thin neck is pulled, which prevents propagation of dislocation lines.

After the pulling of the single crystal, which corresponds to the prior art of Czochralski-pulled crystal (apart from the measures for setting the desired misorientation), beginning and end cones are preferably sliced off. The crystal piece is then ground cylindrically parallel to a defined crystal direction. In this case, the single crystal piece is arranged in such a way that the desired crystal orientation is defined by the pressure members applied at the ends. The crystal orientation may be determined by an X-ray goniometer. A corresponding method for oriented cylindrical grinding and a suitable device are disclosed in the European patent specification EP 0 962 284 B 1.

The single crystal is preferably ground cylindrically to a uniform diameter of, in each case, somewhat more than the final wafer diameter. The oriented cylindrical grinding makes it possible to set a desired misorientation of the ingot piece or to correct the misorientation resulting from pulling.

Preferably, the magnitude of the misorientation of the pulled crystal is reduced by e.g. approximately 1°, such that for example for the case where the magnitude of the misorientation after pulling is approximately 1.5°, a misorientation with a magnitude of approximately 0.5° results after the cylindrical grinding. Preferably, during the oriented cylindrical grinding, the misorientation according to CZ is tilted in the direction sought in terms of production engineering, that is to say e.g. in the direction of the nearest <111> or <100> plane (cf. FIG. 1). The magnitude and direction of the misorientation change as a result.

The cylindrically ground rod piece is subsequently sliced into wafers by means of a wire saw. This is preferably effected for the single crystal by fixing the latter on a sawing strip tilted relative to the wire gang of the wire saw in such a way that the sawn wafers have a surface with a misoriented <110> crystal plane defined according to magnitude and direction. However, it is especially preferred for the desired misorientation to be achieved solely by the pulling of the single crystal and by the subsequent oriented cylindrical grounding as described above. In this preferred embodiment, no or at most marginal changes in the misorientation (of magnitude and direction) occur during the wire sawing step, which is effected in accordance with the prior art.

Figure 8:
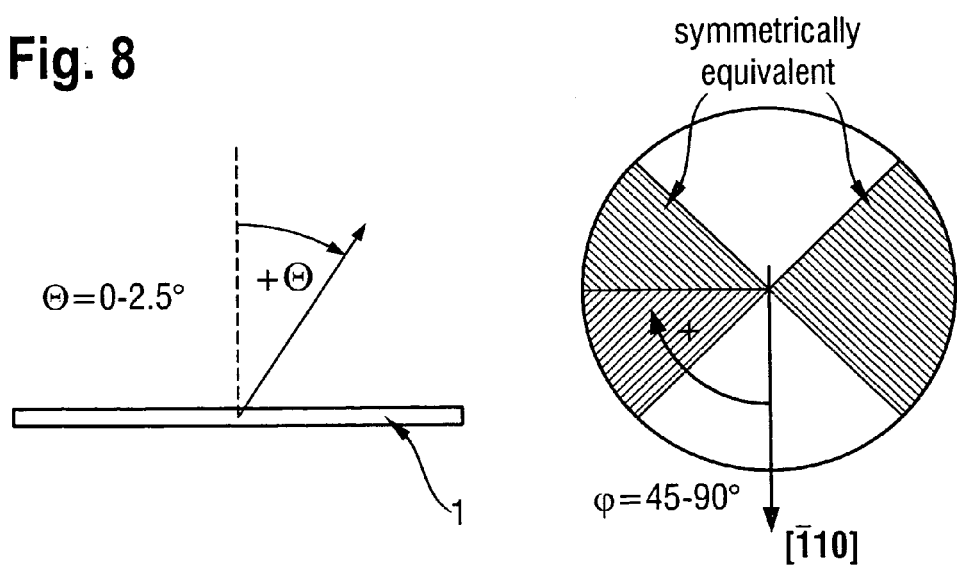
FIGS. 8 and 9 illustrate preferred and more preferred solid angle ranges of misorientation.
Figure 9:
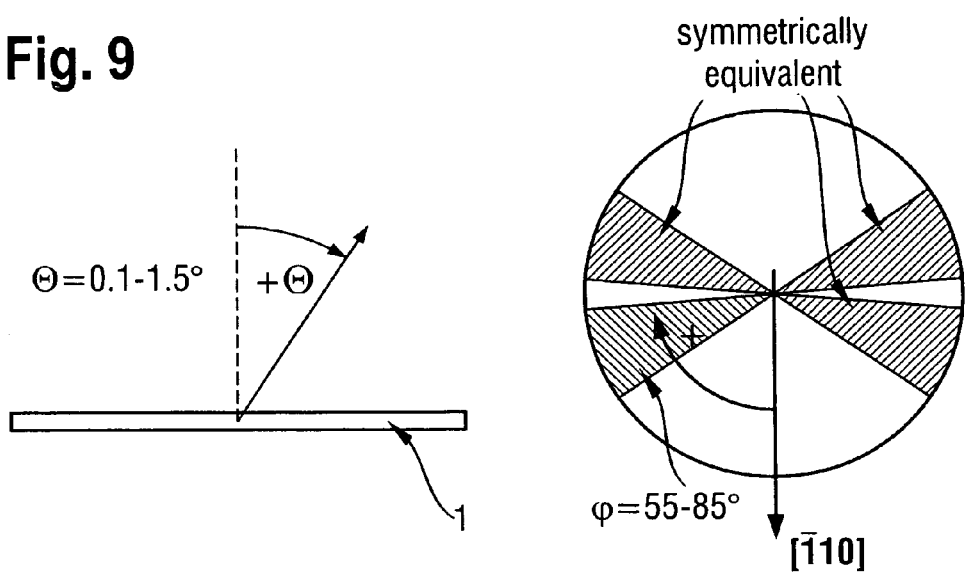

The sliced wafers thus have a misoriented <110> surface that can be expressed by the solid angles $\phi$ and $\theta$. The misorientation of the sliced wafers is $\theta=0$ to 3°, $\phi=45$ to 90° (and all symmetrically equivalent directions). More preferably, $\phi=55$ to 85° and $\theta=0$ to 2.5° (and all symmetrically equivalent directions, FIG. 8), and most preferably, $\phi=60$ to 80° and $\theta=0.1$ to 1.5° (and all symmetrically equivalent directions, FIG. 9).

After the wafers have been sliced from the crystal, machining steps are effected, which have the goal of globally leveling the wafers and providing them with smooth, defect- and particle-free surfaces and edges. These are preferably purely mechanical methods such as single-side or double-side grinding (SSG, DDG, coarse and/or fine grinding), and/or lapping, chemical methods such as etching (acidic or alkaline) and cleaning steps, chemical mechanical methods such as single-side and double-side removal polishing (SSP, DSP) or chemical mechanical haze-free polishing (CMP). No changes in the misorientations of the <110> surfaces are provided in these machining steps. At most marginal changes occur which are unavoidable in terms of process engineering.

The wafers machined in this way are preferably provided with an epitaxial layer. The roughness of the deposited epitaxial layer is crucially influenced by the previously set misorientation of the <110> surface of the epitaxial substrate. Some of the method steps are described in more detail below.
Crastal Pulling <110>

Firstly, a silicon single crystal is produced by using a seed crystal in which the <110> crystal direction is inclined at a predetermined angle with respect to the axial direction (misoriented seed). A quartz crucible with a silicon melt for pulling the crystal is provided for this purpose.

The seed crystal, which is fitted on a seed crystal holder, is dipped into the silicon melt. The seed crystal holder is subsequently raised and silicon is grown while the seed crystal holder and the crucible are rotated in the same direction or in opposite directions. It should be noted, that in the CZ method, the axial longitudinal direction of the seed crystal corresponds to the pulling direction.

A narrowing process (reduction of the cross section) of the diameter of the silicon crystal is preferably carried out after the seed crystal has been brought into contact with the melt surface (dash necking). A dislocation network consequently forms, caused by the thermal shock. The growing of the thin neck prevents the dislocations from propagating into the subsequently pulled crystal piece.

The seed crystal is subsequently raised further and a silicon rod composed of monocrystalline silicon is produced. The pulled silicon rod finally comprises an upper part, which was formed by the dash necking process, a straight cylindrical body and generally also an end piece part, in which the diameter was reduced. This results in a state in which the direction of the tilting of the <110> crystal direction with respect to the axial direction of the seed crystal is the direction of the nearest {111} crystal face alongside the {110} crystal face, that is to say in the [001] direction. Furthermore, the direction of the tilting of the <110> crystal direction with respect to the axial direction of the seed crystal can be the direction of the {100} crystal face alongside the {110} crystal face, that is to say in the [110] direction. Preferably, beginning and end cones are then sliced off.

Oriented Cylindrical Grinding

The oriented cylindrical grinding makes it possible to set a desired misorientation of the crystal or to correct a misorientation resulting from pulling. Preferably, the misorientation of the pulled crystal is reduced by approximately 1°, such that for the case where the single crystal has a misorientation of approximately 1.5° after pulling, a misorientation of approximately 0.5° results after the cylindrical grinding. Preferably, for this purpose the crystal axis is oriented in the desired manner and then pressure members are fixed, e.g. adhesively bonded, to the ends of the crystal. The crystal is clamped by said pressure members during grinding in a grinding machine. The single crystal is subsequently ground until it has a predetermined, uniform final diameter.

Wire Sawing

The cylindrically ground single crystal is subsequently sliced into wafers by means of a wire saw. During wire sawing, a multiplicity of wafers are sliced from a crystal piece in one work operation. U.S. Pat. No. 5,771,876 describes the functional principle of such a wire saw. Wire saws have a wire gang formed by a sawing wire that is wound around two or more wire guide or deflection rollers. The sawing wire can be coated with an abrasive coating. When using wire saws having sawing wire without fixedly bonded abrasive grain, abrasive grain in the form of a slurry is supplied during the slicing process.

During the slicing process, a crystal piece fixed on a table penetrates the wire gang, in which the sawing wire is arranged in the form of wire sections lying parallel alongside one another. The penetration of the wire gang is brought about by a relative movement between table and wire gang which is realized by means of an advancing device and which guides the crystal piece toward the wire gang (table advance) or the wire gang toward the crystal piece.

Preferably, the single crystal is fixed on a table that is tilted relative to the wire gang of the wire saw in such a way that the sawn wafers have a surface having a misoriented <110> crystal plane defined according to magnitude and direction, that is to say that the misorientation that results after oriented cylindrical grinding can be corrected further. However, it is particularly preferred to carry out the wire sawing step without altering the misorientation, that is to say without tilting the table or sawing strip relative to the wire gang. The wire gang and sawing strip (or a guide edge of the sawing strip) are intended to form an angle of 90°, such that the crystal orientation of the sliced silicon wafers corresponds to the crystal orientation of the single crystal after cylindrical grinding.

EXAMPLE

The procedure can be illustrated on the basis of the following exemplary embodiment. A 300 mm crystal was pulled by means of a slightly misoriented <110> seed according to the Czochralski method including dash necking, and the beginning and end cones were sliced off and the rod piece was divided into individual rod segments.

On the rod piece with the end position at 14 cm and the length of 10 cm, the misorientation between the geometrical rod piece axis and the <110> direction was determined as $\theta=2.14°$ and $\phi\sim0°$. The target for the end product was an orientation of $\theta=0.6°$ and $\Phi$ almost 90°.

After the oriented cylindrical grinding, the situation was $\theta=0.52°$ and $\phi=88.9°$. A standard wire sawing process, without tilting of the table or sawing strip relative to the wire gang resulted in further, marginal alterations of the off-orientation, these being caused by process-technological fluctuations. The off-orientation after the wafers had been singulated was determined as $\theta=0.54°$ and $\phi=81.4°$ (also see table 1, last row). The predetermined target for the off-orientation of the wafer surface of $\theta=0.6°$ was able to be fully achieved within the bounds of the production tolerances known for the prior art ($\Delta\theta=\pm0.2°$). The tolerances of $\phi$ that can be achieved in terms of production engineering are greatly dependent on the magnitude of $\theta$ and, for an angle $\theta$ of approximately 0.6°, can be estimated as delta $\phi=\pm10°$.

Mechanical and Chemo-Mechanical Machining Steps

Preferably the following machining steps are effected after the wire sawing:

rounding the mechanically sensitive edges, carrying out an abrasive step such as groundings or lapping. EP 547894 A1 describes a lapping method; grinding methods are disclosed in applications EP 272531 A1 and EP 580162 A1.

The final flatness of the <110>-oriented silicon wafer is produced by one or more polishing processes, which can optionally be preceded by an etching step for removing disturbed crystal layers and for removing impurities. A suitable etching method is known for example from DE 19833257 C1.

The group of chemo-mechanical machining steps comprises polishing steps by means of which the surface is smoothed and residual damage of the surface is removed by partly chemical reaction and partly mechanical material removal (abrasion).

While the traditional polishing methods that work on one side ("single-side polishing") generally lead to poorer planeparallelisms, polishing methods that act on both sides ("double-side polishing"), make it possible to produce wafers having improved flatness.

After the grinding, cleaning and etching steps, the surface of the wafers is smoothed by material removal polishing. In the case of single-side polishing (SSP), wafers are held during machining on the rear side on a carrier plate by means of cement, vacuum or adhesion. In the case of double-side polishing (DSP), the wafers are introduced loosely into a thin toothed disk and are polished on the front and rear sides simultaneously in a "floating freely" manner between an upper and a lower polishing plate covered with a polishing cloth.

Furthermore, the front sides of the silicon wafers are polished in a haze-free manner, for example by means of a soft polishing cloth with the aid of an alkaline polishing sol. In order to retain the geometry of the semiconductor wafers produced up to this step, the material removals are in this case relatively small, e.g. from 0.05 to 1.5 µm. In the literature, this step is often referred to as CMP polishing ("chemo-mechanical polishing").

Epitaxial Coating

The monocrystalline <110>-oriented silicon wafers are subsequently provided with a monocrystalline grown layer of silicon of the same crystal orientation, in a so-called epitaxial coating. Such epitaxially coated silicon wafers have certain advantages over silicon wafers composed of homogeneous material, for example the prevention of charge reversal in bipolar CMOS circuits followed by the short circuit of the component ("latch-up" problem), lower defect densities (for example reduced number of COPs ("crystal-originated particles")) and the absence of an appreciable oxygen content, whereby it is possible to preclude a risk of short circuit as a result of oxygen precipitates in component-relevant regions.

For this purpose, in the epitaxy reactor, one or more silicon wafers on a susceptor is or are heated by means of heating sources, preferably by means of upper and lower heating sources, for example lamps or lamp banks, and then exposed to a gas mixture, composed of a source gas (silanes) comprising a silicon compound, a carrier gas (for example hydrogen) and, if appropriate a doping gas (for example diborane).

The epitaxial layer is preferably deposited according to the CVD method ("chemical vapor deposition") where, as source gas, silanes, for example trichlorosilane ($SiHCl_3$, TCS), are passed to the surface of the silicon wafer and decomposed there at temperatures of 600 to 1250° C. to form elemental silicon and volatile byproducts and form an epitaxially grown silicon layer on the silicon wafer. The epitaxial layer can be undoped or doped in a targeted manner by means of suitable doping gases, with boron, phosphorus, arsenic or antimony being preferred to set conduction type and conductivity.

Methods which are suitable for optimizing other important geometrical parameters of an epitaxially coated silicon wafer (SFQR, GBIR and edge roll-off) and which relate in particular to pretreatments of the silicon wafer during the epitaxy process ($H_2$ bake process, HCl etching treatment in order to remove native oxide) and pretreatments of the susceptor are described in the applications DE102005045337 A1, DE102005045338 A1 and DE102005045339 A1 and are preferably also employed in the method according to the invention.

TABLE 1

| $\Theta$ [°] | $\phi$ [°] | $\phi^*$ [°] (converted to the 1st quadrant) | AFM RMS [nm] (1 µm × 1 µm) |
| --- | --- | --- | --- |
| 0.24 | 14.6 | 14.6 | 0.182 |
| 0.75 | 224.0 | 44.0 | 0.142 |
| 2.28 | 4.01 | 4.01 | 0.736 A |
| 0.35 | 44.17 | 44.17 | 0.136 |
| 0.98 | 266.5 | 86.5 | 0.086 |
| 1.49 | 264.6 | 84.6 | 0.089 B |
| 1.99 | 267.7 | 87.7 | 0.081 |
| 0.49 | 4.67 | 4.67 | 0.307 |
| 0.93 | 1.8 | 1.8 | 0.408 |
| 0.38 | 270.0 | 0.0 | 0.249 |

TABLE 1-continued

| Θ [°] | φ [°] | φ* [°] (converted to the 1st quadrant) | AFM RMS [nm] (1 μm × 1 μm) |
|---|---|---|---|
| 0.51 | 266.6 | 86.6 | 0.081 |
| 0.51 | 5.6 | 5.6 | 0.248 |
| 0.54 | 179.9 | 0.1 | 0.289 |
| 0.54 | 184.3 | 4.3 | 0.275 |
| 1.18 | 68.0 | 68.0 | 0.055 C |
| 0.54 | 98.6 | 81.4 | 0.083 |

A clear relationship between the roughness values and the solid angles θ [°], φ [°] can be seen from table 1 in conjunction with FIG. 7. The angles φ were mapped onto the first quadrant. This results in the angles φ*, which are also plotted toward the right in FIG. 7.

One embodiment of the invention is achieved by means of an epitaxially coated silicon wafer, comprising a plane misoriented relative to a (110) crystal plane as wafer surface, wherein the <110> direction is tilted away by the angle θ from the normal to the wafer surface and the projection of the tilted <110> direction forms an angle φ with the direction <-110> in the wafer plane and θ is given by $0 \leq θ < 3°$ and $45° \leq φ \leq 90°$ (and all symmetrically equivalent directions).

Particular preference is attached to such epitaxially coated silicon wafers having misoriented (110) crystal planes as wafer surfaces, characterized by φ=55-85° and θ=0-2.5°, and all symmetrically equivalent directions. Likewise special preference is attached to epitaxially coated silicon wafers having misoriented (110) crystal planes as wafer surfaces, characterized by φ=60-80° and θ=0.1-1.5°, and all symmetrically equivalent directions.

The epitaxially coated silicon wafers according to the invention are distinguished by particularly low roughness values according to AFM RMS of ~0.055-0.089 nm. Such low roughness values were not achievable in the prior art, cf. EP 1 592 045 A1, FIG. 9 (comparison values: 0.10 and 0.12 nm). Moreover, it was assumed in the prior art that the angle θ was crucial for the roughness values obtained and values for θ of 0-8° are suitable. The present invention for the first time discloses that the insights in the prior art are incomplete and solid angles have to be taken into consideration in the investigation of misoriented wafer surfaces. The relationship with the angle φ as shown in FIG. 7 makes this clear.

The misorientations which were expressed as solid angles in the context of this invention can likewise be designated by the "Miller indices" that are well known to the person skilled in the art, for example Θ=1.5° and φ=45°, 60°, 80°, 90°, expressed in Miller indices: (719 696 18), (722 690 13), (725 688 4), (725 688 0); Θ=0.5° and φ=45°, 60°, 80, 90°, expressed in Miller indices: (711 702 6), (712 701 4), (713 7011), (713 700 0).

Further examples for converting solid angle indications into Miller indices:

Θ=2°, φ=-90°=(681 731 0); Θ=1.5°, φ=-90°=(688 722 0);

Θ=1°, φ=-90°=(694 719 0); Θ=1°, φ=-45°=(698 715 1);

Θ=1°, φ=45°=(715 698 1).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing an epitaxially coated silicon wafer comprising:
    a) pulling a silicon single crystal with <110> orientation according to Czochralski, using a seed crystal with <110> orientation, the geometrical axis of which is inclined by a specific angle relative to its real [110] crystal axis, such that the pulled <110>-oriented silicon single crystal also has a slight misorientation of its geometrical axis relative to its real [110] crystal axis;
    b) oriented cylindrical grinding of said silicon single crystal by determining the misorientation of the silicon single crystal that results after pulling, orienting the single crystal in a grinding machine, and grinding away an outer surface of the single crystal until the latter has a targeted, uniform diameter and the misorientation resulting from pulling of the single crystal is reduced or a targeted misorientation different from the misorientation resulting from pulling is established;
    c) slicing the cylindrically ground single crystal into wafers by means of a wire saw, whereby the silicon single crystal is fixed on a sawing strip tilted relative to the wire gang of the wire saw in such a way that the sawn wafers have a surface with a misoriented <110> crystal plane defined according to magnitude and direction to form sliced wafers;
    d) further processing of the sliced wafers by means of mechanical, chemical, or chemo-mechanical methods, by means of which the misorientation of the surface remains largely unchanged; and
    e) applying an epitaxial layer to the wafer,
    wherein the <110> direction is tilted away by the angle θ from the normal to the wafer surface and the projection of the tilted <110> direction forms an angle φ with the direction <-110> in the wafer plane, wherein $0 \leq θ \leq 3°$ and $45° \leq φ \leq 90°$, and for all symmetrically equivalent directions.

2. The method of claim 1, wherein a dash necking method is employed wherein after a seed crystal has been brought into contact with a polysilicon melt situated in a crucible, a thin neck is first pulled.

3. The method of claim 1, wherein the single crystal is cylindrically ground to a uniform diameter which exceeds nominal wafer diameters of 150 mm, 200 mm, 300 mm or 450 mm.

4. The method of claim 1, wherein, prior to oriented cylindrical grinding, a misorientation is determined by means of an X-ray goniometer.

5. The method of claim 1, wherein, during oriented cylindrical grinding, a misorientation of the pulled crystal is reduced by approximately 1° or more, and the direction of the misorientation, after cylindrical grinding, is tilted in a targeted direction.

6. The method of claim 1, wherein the sliced wafers have a misoriented <110> surface, wherein the misorientation is θ=0-2.5° and φ=55-85°.

7. The method of claim 6, wherein the misorientation is θ=0.1-1.5° and φ=60-80°.

8. The method of claim 6, wherein the sliced wafers have a misoriented <110> surface, wherein the <110> plane is tilted in the direction of a nearest <111> plane or in the direction of a nearest <011> plane.

* * * * *